US007768358B2

(12) United States Patent
Inoue

(10) Patent No.: US 7,768,358 B2
(45) Date of Patent: Aug. 3, 2010

(54) OSCILLATORY SIGNAL OUTPUT CIRCUIT FOR CAPACITIVE COUPLING AN OSCILLATING SIGNAL WITH BIAS VOLTAGE APPLIED

(75) Inventor: Yuichiro Inoue, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 61 days.

(21) Appl. No.: 11/941,327

(22) Filed: Nov. 16, 2007

(65) Prior Publication Data

US 2008/0211591 A1 Sep. 4, 2008

(30) Foreign Application Priority Data

Mar. 2, 2007 (JP) .............................. 2007-053021

(51) Int. Cl.
*H03B 1/00* (2006.01)
*H03B 5/36* (2006.01)
(52) U.S. Cl. .................................. 331/74; 331/116 FE
(58) Field of Classification Search .................. 331/74, 331/75, 158, 116 R, 116 FE, 185, 186
See application file for complete search history.

(56) References Cited

U.S. PATENT DOCUMENTS 4,956,618 A * 9/1990 Ulmer .................. 331/116 FE 5,355,099 A * 10/1994 Murooka .................... 331/158
5,757,242 A * 5/1998 Chow et al. .................... 331/57
6,137,374 A * 10/2000 Merrill ........................ 331/158
7,345,528 B2 * 3/2008 Zanchi et al. ................ 327/562

FOREIGN PATENT DOCUMENTS

JP 6-097732 4/1994
JP 2004205957 A * 7/2004

* cited by examiner

*Primary Examiner*—Robert Pascal
*Assistant Examiner*—Ryan Johnson
(74) *Attorney, Agent, or Firm*—Studebaker & Brackett PC; Donald R. Studebaker

(57) ABSTRACT

Oscillatory signal output circuitry includes a bias circuit generating a bias voltage, which is applied to an amplifier and an oscillatory circuit to generate an oscillatory signal. The oscillatory signal is capacitively coupled and level-shifted up by the bias voltage to produce output signals. The produced output signals are operatively applied to PMOS and NMOS transistors of an output part. When the voltages of the output signals decrease at the same time, the drain current of the NMOS transistor decreases to output a high level. When the voltages of the output signals increase at the same time, the drain current of the NMOS transistor increases to output a low level. Therefore, the output part attains its large gain, and is ensured to operate to develop the output signal. A variation in threshold voltage would cause the bias voltages to change accordingly, thus being ensured to output the output signal.

2 Claims, 3 Drawing Sheets

OSCILLATORY SIGNAL OUTPUT CIRCUIT FOR CAPACITIVE COUPLING AN OSCILLATING SIGNAL WITH BIAS VOLTAGE APPLIED

BACKGROUND OF THE INVENTION

1. Field of the Invention

The present invention relates to an oscillatory signal output circuit generating an oscillatory signal.

2. Description of the Background Art

A conventional oscillatory signal output circuit, especially a crystal oscillator circuit, includes an amplifier for amplifying a small-amplitude waveform generated by a quartz oscillator device, or crystal resonator, to output a resultant large-amplitude waveform in the form of sinusoidal wave. For example, an oscillatory signal generated as a sine wave by the amplifier is converted by an output circuit to a rectangular wave, which is outputted for use in an LSI (Large-Scale Integrated circuit), etc., as an operational clock.

An example of oscillatory circuit suitable for fabrication as an LSI and stably operable at low-voltage power supply, specifically 1.0V-1.5V, with its electric power consumption reduced is disclosed by Japanese Patent Laid-Open Publication No. 097732/1994.

However, a reduction of the electric power consumption of an oscillatory circuit needs to reduce the electric power consumption of the amplifier per se. That may cause the amplitude of an output signal from the amplifier to decrease so that variation in threshold voltage of the transistor of an output section of the oscillatory circuit driven by the output signal may prevent the output signal from going over the threshold voltage, thus causing a failure that the transistor is inoperable to the extent that no signal is outputted from the output section. In the context, the word "transistor" means at least one of a P-type and an N-type field effect transistor.

SUMMARY OF THE INVENTION

It is therefore an object of the present invention to provide an oscillatory signal output circuit that enables the transistor of its output section to be operable, despite low power consumption, to ensure that its output section produces an output signal.

In accordance with the present invention, oscillatory signal output circuitry comprises a reference oscillatory signal amplifier amplifying a reference oscillatory signal, an oscillatory signal modification circuit generating a plurality of modification oscillatory signals with the DC component of the amplified reference oscillatory signal rejected and the AC component of the amplified reference oscillatory signal extracted, a bias voltage generator applying a plurality of bias voltages to the plurality of modification oscillatory signals, and an output signal generator amplifying the plurality of modification oscillatory signals to which the bias voltages are applied to generate an output signal.

In accordance with the invention, the reference oscillatory signal amplifier amplifies the reference oscillatory signal generated by a bias circuit, etc. The oscillatory signal modification circuit generates the plurality of modification oscillatory signals with the DC component rejected and the AC component extracted (capacitive coupling). In addition, the bias voltage generator applies a plurality of bias voltages to the plurality of modification oscillatory signals. The output signal generator generates the output signal by amplifying the plurality of modification oscillatory signals to which the bias voltages are applied.

Therefore, the transistors, which may be a P-type field effect transistor and an N-type field effect transistor, are enabled to operate certainly, so that the output signal generator accomplishes large gain, and it can be ensured that the output signal is generated in the form of rectangular wave.

In accordance with an aspect of the invention, oscillatory signal output circuitry comprises a reference oscillatory signal amplifier amplifying a reference oscillatory signal, an oscillatory signal modification circuit generating a plurality of modification oscillatory signals with the DC component of the amplified reference oscillatory signal rejected and the AC component of the amplified reference oscillatory signal extracted, a first bias voltage generator applying a first bias voltage to one of the modification oscillatory signals, a second bias voltage generator applying a second bias voltage to another of the modification oscillatory signals, and an output signal generator amplifying the one modification oscillatory signal to which the first bias voltage is applied and the other modification oscillatory signal to which the second bias voltage is applied to generate an output signal.

In accordance with the aspect of the invention, the reference oscillatory signal amplifier amplifies the reference oscillatory signal generated by the bias circuit, etc. The oscillatory signal modification circuit generates the modification oscillatory signals with DC component rejected and the AC component extracted. In addition, the first bias voltage generator applies the first bias voltage to the one modification oscillatory signal. Also, the second bias voltage generator applies the second bias voltage to the other modification oscillatory signal. The output signal generator amplifies the one modification oscillatory signal to which the first bias voltage is applied and the other modification oscillatory signal to which the second bias voltage is applied to thereby generate the output signal.

Therefore, the transistors are ensured to operate, thus the output signal generator accomplishing large gain. It can therefore be ensured that the output signal is generated in the form of rectangular wave.

In accordance with another aspect of the invention, oscillatory signal output circuitry comprises a first node receiving a signal oscillating in an oscillatory circuit, a first capacitor connected between the first node and a second node, a second capacitor connected between the first node and a third node, a first bias voltage generator connected to the second node and providing the second node with the first bias voltage, a second bias voltage generator connected to the third node and providing the third node with the second bias voltage, and an output signal generator connected to the second node, the third node and an output node and producing the signal on the output node in response to a signal appearing on at the second and third nodes.

In accordance with the other aspect of the invention, the first node receives the signal oscillating in the oscillatory circuit. The first bias voltage generator is connected to the second node through the first capacitor connected between the first and second nodes, and provides the second node with the first bias voltage based on the signal oscillating in the oscillatory circuit. The second bias voltage generator is connected to the third node through the second capacitor connected between the first and third nodes, and provides the third node with the second bias voltage based on the signal oscillating in the oscillatory circuit. In addition, the output signal generator is connected to the second, third and output nodes, and generates the signal on the output node in response to a signal appearing on the second and third nodes.

Thus, the signal is developed on the output node in response to the signal appearing on the second and third nodes, thereby certainly acquiring the output signal.

The present invention has a superior effect that provides the oscillatory signal output circuitry that enables the transistors of the output signal generator, i.e. output circuit, to output an output signal even with low-power consumption.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
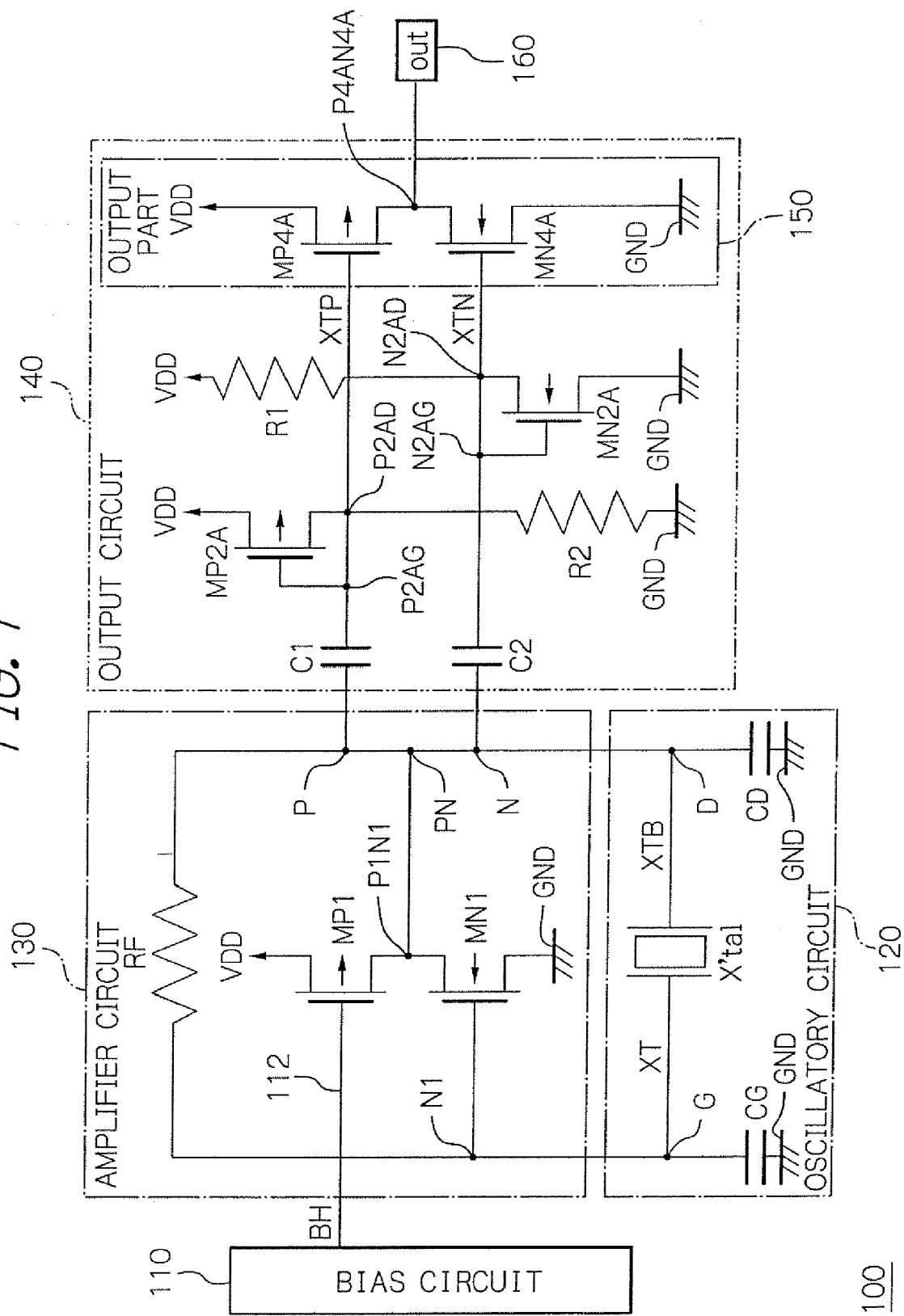
FIG. 1 is a schematic circuit diagram of an illustrative embodiment of the oscillatory signal output circuit in accordance with the present invention.

Reference will first be made to FIG. 1 showing a preferred embodiment of an oscillatory signal output circuit in accordance with the present invention. An oscillatory signal output circuit 100 is comprised of a bias circuit 110, an oscillatory circuit 120, an amplifier 130, an output section 140 including an output part 150, and an output terminal (OUT) 160, which are interconnected as illustrated. It is noted that in the following description the term "PMOS (P-type Metal-Oxide Semiconductor) transistor" refers to a P-type field effect transistor, and "NMOS (N-type Metal-Oxide Semiconductor) transistor" to an N-type field effect transistor.

The bias circuit 110 is connected by a bias signal line 112 to the amplifier 130 serving as its subsequent stage. The bias circuit 110 generates a bias voltage BH, which may be, for example, be about 0.5V, and outputs the bias voltage BH to the amplifier 130 on the bias signal line 112. The bias voltage BH is for use in constant-current control for a PMOS transistor MP1 in the amplifier 130.

The bias circuit 110 may be a conventional circuit, such as any type of circuit that can generate and output the bias voltage BH of low power supply voltage, which may be, for example, about 0.5V.

The oscillatory circuit 120 is comprised of a crystal resonator X'tal, and capacitance elements, or capacitors, CD and CG, which are interconnected with connection points, or nodes, D and G, as depicted.

Each of the capacitors CD and CG has its one plate connected to a different electrode of the crystal resonator X'tal by corresponding one of the nodes D and G, and its other plate connected to a reference level GND, i.e. grounded. Usually, the crystal resonator X'tal, when an AC (alternating current) voltage is applied, amplifies the voltage and oscillates. To the capacitors CD and CG, ceramic capacitors are advantageously applicable which have an appropriate capacitance for stabilizing the oscillation frequency of the oscillatory signal, i.e. reference oscillatory signal, generated by the crystal resonator X'tal and attaining an intended oscillation frequency and amplitude.

In the illustrative embodiment, the oscillatory circuit 120 is adapted to extract the oscillatory signal by using the crystal resonator X'tal. So far as an intended oscillation frequency and amplitude can be obtained, however, any circuit configuration may be applicable other than using a crystal resonator. For example, an oscillatory circuit using a ceramic resonator, a CR oscillation circuit, an LC tuning oscillation circuit, etch, can be used if they are available. Use of a crystal resonator for the purpose of generating an oscillatory signal can control the stable frequency oscillation of an intended amplitude and voltage level with higher accuracy.

The amplifier 130 is comprised of the PMOS transistor MP1, an NMOS transistor MN1, and a feedback resistance element, or feedback resistor, RF, interconnected as shown by nodes N1, P1N1, PN, P and N. It can be said that the amplifier 130 has a basic circuit configuration.

The bias signal line 112 of the bias circuit 110 is connected to a gate electrode of the PMOS transistor MP1, which has its source electrode connected to a power supply voltage VDD, which may be, for example, about 0.7V, its drain electrode connected to a drain electrode of the NMOS transistor MN1 so as to enable the output signal to be transferred through the node P1N1. The NMOS transistor MN1 has its source electrode grounded (GND), its gate electrode connected to an output signal line of the drain electrodes of the PMOS transistor MP1 and the NMOS transistor MN1 through the feedback resistance RF and the node N1, and its drain electrode connected to the drain electrode of the PMOS transistor MP1, so as to enable the output signal to be conveyed to the nodes P1N1, PN, P and N. From the node P and N, the same output signal XTB, refer to FIG. 3 also, is transmitted to the output section 140 at the same time.

The amplifier 130 may be any type of amplifier having its configuration that is operative in response to the bias voltage BH provided from the bias circuit 110 to amplify the output signal of, e.g. sinusoidal wave, oscillating by the oscillatory circuit 120 to output or transmit the output signal to the output section 140.

The bias signal line 112 is connected from the bias circuit 110 to the amplifier 130, and the oscillatory circuit 120 is connected to the amplifier 130 through the nodes D and G by signal lines. A signal line from the node D of the oscillatory circuit 120 is connected to the output line of the amplifier 130 by the node N, PN and P, and in turn connected to the subsequent output section 140 by a couple of signal lines outgoing from the node P and N. The bias circuit 110, the oscillatory circuit 120, and the amplifier 130 thus form a reference oscillatory signal amplifier.

The output section 140, sometimes referred to as a bias voltage generator, is comprised of capacitance elements C1 and C2, a PMOS transistor MP2A, an NMOS transistor MN2A, resistance elements R1 and R2, and the output part 150, which are interconnected by nodes P2AG, P2AD, N2AG and N2AD as illustrated. The output part 150 forms an output signal generator circuit.

The capacitor C1 has its one end connected to the node P of the amplifier 130, and its other end connected to the node P2AG in the output section 140. The capacitor C1 is called a coupling capacitor, and works as a filter rejecting a direct current (DC) component and allowing only an alternate current (AC) component to pass. Particularly, the capacitor C1 capacitive-couples the output signal of sine wave generated from the oscillatory circuit 120 and the amplifier 130 to the output section 140. The capacitive coupling of the two circuits prevents interference therebetween due to the existence of a difference in DC voltage between the input and output of both circuits, or offset current or voltage of one circuit to the other. An oscillatory signal thus modified is produced. That is also the case with the other capacitor C2.

The PMOS transistor MP2A has its node P2AG connected to its gate electrode, its source electrode connected to the power supply voltage VDD, and its drain electrode connected to the node P2AD.

The output section also includes a resistor R2 having its one end connected to the node P2AD, and its other end grounded (GND).

The NMOS transistor MN2A has its gate electrode connected to the node N2AG, its source electrode grounded (GND), and its drain electrode connected to the node N2AD.

The output section also includes another resistor R1 having its one end connected to power supply voltage VDD, and its other end connected to the node N2AD.

The output part 150 is comprised of a PMOS transistor MP4A and an NMOS transistor MN4A, interconnected as shown. The PMOS transistor MP4A has its gate electrode connected to the node P2AD of the output section 140, its source electrode connected to the power supply voltage VDD, and its drain electrode connected to the node P4AN4A.

The NMOS transistor MN4A has its gate electrode connected to the node N2AD of the output section 140, its source electrode grounded (GND), and its drain electrode connected to the node P4AN4A, which forms the output terminal (OUT) 160.

The output section 140 including the output part 150, the bias circuit 100, the amplifier 130, and the output port (OUT) 160 are fabricated on a single chip of LSI together whereas only the oscillatory circuit 120 is disposed outside of the one chip of LSI and interconnected to the oscillatory circuit 120 formed on the one chip of LSI by the shortest length of connection.

In operation, from the bias circuit 110, applied is a bias signal, or the bias voltage BH (approximately 0.5V with the illustrative embodiment), to the amplifier 130 on the bias signal line 112. The bias voltage BH is applied to the gate electrode of the PMOS transistor MP1 of the amplifier 130 from the bias signal line 112. Applying the bias voltage BH to the gate electrode of the PMOS transistor MP1, which has its threshold voltage approximately equal to 0.55V with the embodiment, enables the PMOS transistor MP1 to be operative or conductive, i.e. "active", and thus a voltage (about 0.7V) is applied from the power supply DVD to thereby conduct a constant current flowing through the PMOS transistor MP1.

Thus, the constant current determines a voltage (about 0.3V with the embodiment) which is applied to the gate electrode of the NMOS transistor MN1, having its threshold voltage equal to about 0.25V, by the voltage VDD through the feedback resistor RF, and the node P1N1, PN, and P. The voltage enables the NMOS transistor MN1 to be active, a voltage or a current applied through the nodes D and G of the oscillatory circuit 120 triggers oscillation of the crystal resonator X'tal of the oscillatory circuit 120, and the amplifier 130 amplifies the oscillating amplitude. At the time, the capacitors CD and CG modify an oscillatory frequency of the crystal resonator X'tal.

Figure 3:
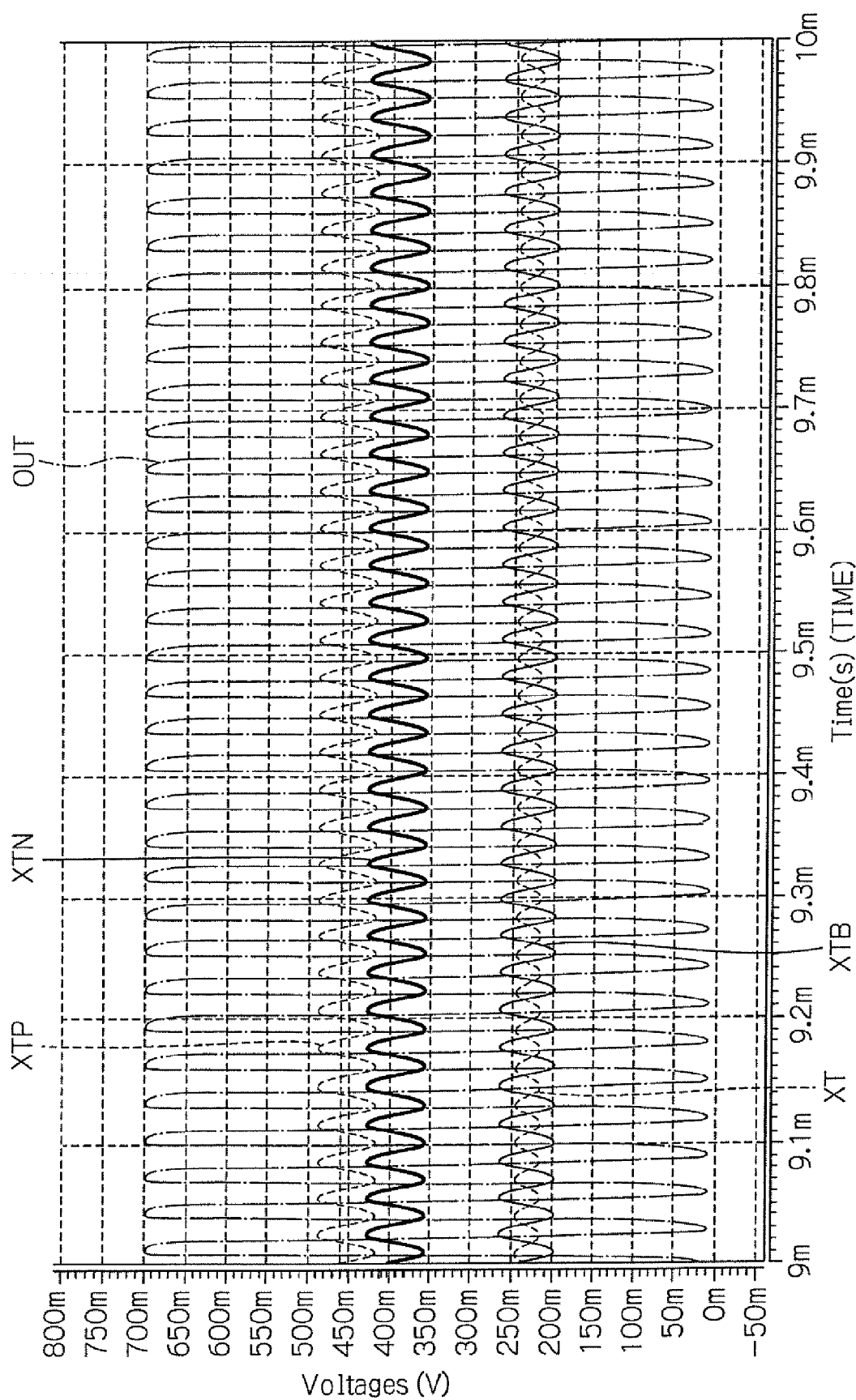
FIG. 3 shows the waveforms of output signals appearing in the illustrative embodiments of the oscillatory signal output circuit.

As shown in FIG. 3, the waveform of the oscillatory signal at the node D is sinusoidal as plotted by the output signal curve XTB, and the waveform of the oscillatory signal at the node C is also sinusoidal as plotted by the curve XT. As seen from the figure, the output signal XT at the node G is smaller in amplitude of the sine waveform than the output signal XTB at the node D because the capacitor CD is smaller in capacitance than the capacitor CG.

In addition, the waveform of the oscillatory signals at the nodes D, N, PN, and P is also sinusoidal as plotted by the output signal curve XTB in FIG. 3. The nodes D, N, PN, and P preceding the capacitor C1 are called a first node.

Description will be made starting with the output signal XTB transferred from the node P to the output section 140. The output signal XTB shown in FIG. 3 is transferred from the node P to the node P2AG through the capacitor C1 with its DC component rejected and its AC component extracted. That is called capacitive coupling and implemented by the oscillatory signal modification circuit in order to generate the modification oscillatory signal. Because the node P2AG is connected to the gate electrode of the PMOS transistor MP2A, the output signal XTB whose DC component is rejected is applied to the gate electrode of the PMOS transistor MP2A. Then, the PMOS transistor MP2A becomes active to cause the power supply voltage VDD to be applied to the resistor R2 so that the first bias voltage is applied on the basis of a current flowing through the resistor R2, thus rendering the output signal XTB level-shifted up and the waveform of the output signal XTB appearing at the node P2AD as shown in FIG. 3. The output signal XTP level-shifted up at the node P2AD is applied to the gate electrode of the PMOS transistor MP4A of the output part 150. The node P2AD subsequent to the capacitor C1 is called a second node.

Now, description will also be given starting with the output signal XTB transferred from the node N to the output section 140. The output signal XTB shown in FIG. 3 is conveyed from the node N to the node N2AG through the capacitor C2 with its DC component rejected and its AC component extracted. That is due to the capacitive coupling, and the oscillatory signal modification circuit operates to generate the modification oscillatory signal. Since the node N2AG is connected to the gate electrode of the NMOS transistor MN2A, the output signal XTB whose DC component is rejected is applied to the gate electrode of the NMOS transistor MN2A. Therefore, the NMOS transistor MN2A becomes active to receive the ground level GND, and the second bias voltage is applied dependent upon a current flowing through the resistor R1. Then, the output signal XTB is level-shifted up, and takes the waveform of the output signal XTN at the node N2AD as shown in FIG. 3. The output signal XTN level-shifted up at the node N2AD is applied to the gate electrode of the NMOS transistor MN4A of the output part 150. The node N2AD subsequent to the capacitor C2 is called a third node.

In the output part 150, applying the output signal XTP from the node P2AD to the gate electrode of the PMOS transistor MP4A enables the PMOS transistor MP4A to be active. At the same time, applying the output signal XTN from the node N2AD to the gate electrode of the NMOS transistor MN4A enables the NMOS transistor MN4A to be active. The PMOS transistor MP4A and the NMOS transistor MN4A operate based on the output signals XTP and XTN, FIG. 3. When the voltages of the output signal XTP applied to the gate electrode of the PMOS transistor MP4A and the output signal XTN applied to the gate electrode of the NMOS transistor MN4A decrease at the same time, the drain current of the NMOS transistor MN4A decreases correspondingly so that a voltage near the high (H) level, equal to about 0.7V, i.e. the power supply voltage level, is outputted. Similarly, when the voltages of the output signal XTP applied to the gate electrode of the PMOS transistor MP4A and the output signal XTN applied to the gate electrode of the NMOS transistor MN4A increase at the same time, the drain current of the NMOS transistor MN4A increases correspondingly, so that a voltage near the low (L) level, equal to about 0.0V corresponding to the ground (GND) level, is outputted. As stated above, in the output part 150, the PMOS transistor MP4A and the NMOS transistor MN4A operate, so that the output signal from the output part 150 is outputted on the output terminal (OUT) 160 through the output node P4AN4A. Refer to the waveform OUT in FIG. 3.

Thus, centering the voltage values of biasing points amplified, modified and level-shifted up by a set of PMOS transistor MP2A and resistor R2 and a set of NMOS transistor MN2A and resistor R1, the amplitudes are applied to the gate electrodes of the PMOS transistor MP4A and the NMOS transistor MN4A, respectively. Therefore, the PMOS transistor MP4A and the NMOS transistor MN4A of the output part 150 attain large gains, and are enabled to operate certainly.

Additionally, the PMOS transistors MP2A and MP4A are comprised of the same PMOS type of transistors, and the NMOS transistors MN2A and MN4A are comprised of the same NMOS type of transistors. Therefore, even if variation in threshold voltage, which may be raised through manufacturing process, is caused, then the voltage values of bias points change correspondingly to each other, the output part 150 thus accomplishing its large gain despite the variation in threshold voltage. Simply stated, because the set of PMOS transistor MP2A and PMOS transistor MP4A and the set of NMOS transistor MN2A and NMOS transistor MN4A enable the transistors to be operated certainly despite a variation in threshold voltage, it can be ensured that the output signal of a rectangular wave is generated which may be used for a clock signal, etc.

Figure 2:
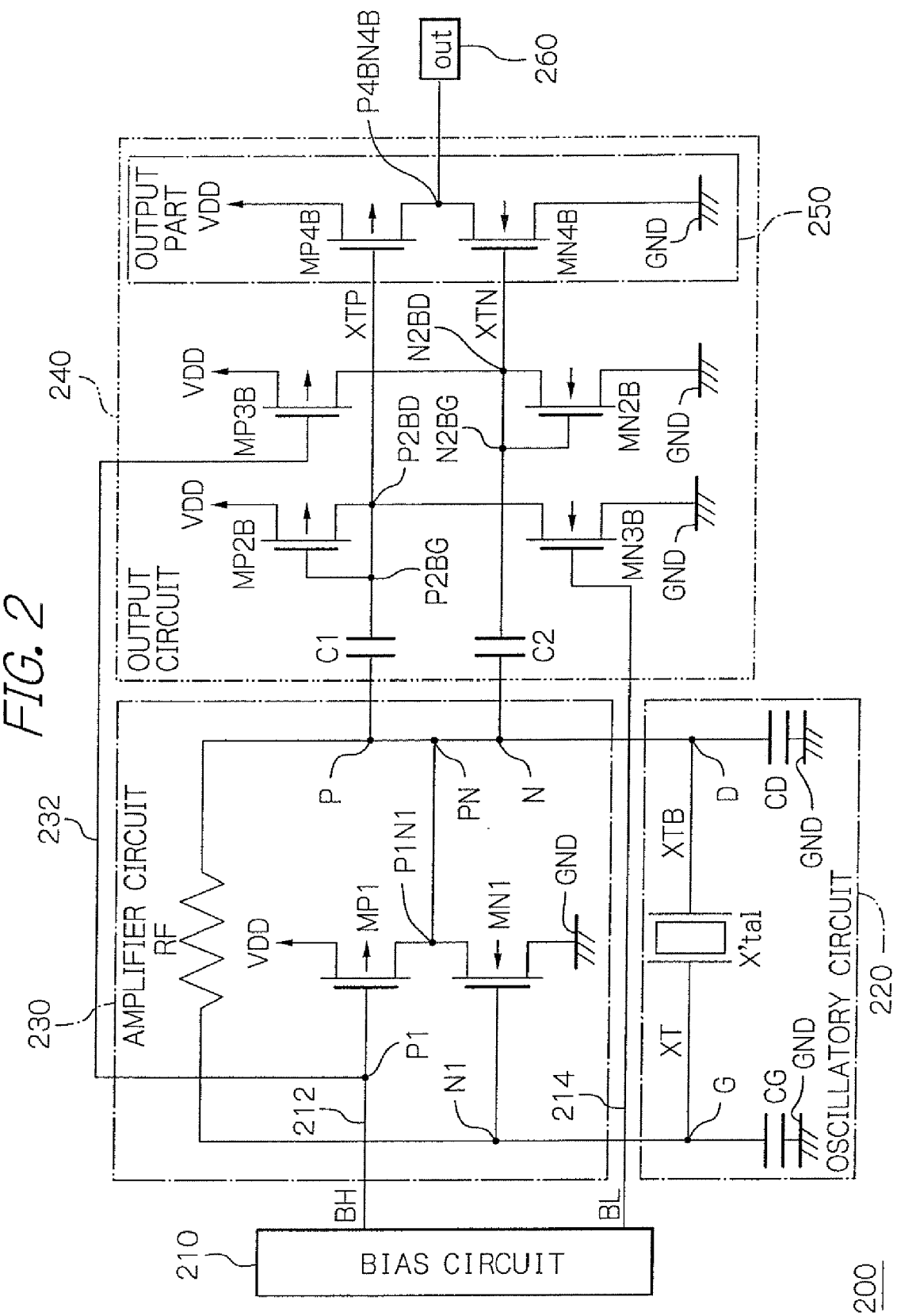
FIG. 2 is also a schematic circuit diagram of an alternative embodiment of the oscillatory signal output circuit in accordance with the invention.

Well, reference will be made to FIG. 2 showing an alternative embodiment of the oscillatory signal output circuit. In the alternative embodiment, an oscillatory signal output circuit 200 is comprised of a bias circuit 210, an oscillatory circuit 220, an amplifier 230, an output section 240 including an output part 250, and an output terminal (OUT) 260, which are interconnected as illustrated. This overall configuration is almost the same as the oscillatory signal output circuit 100 of the embodiment shown in and described with reference to FIG. 1.

The bias circuit 210 is basically the same as the bias circuit 110 of the oscillatory signal output circuit 100, FIG. 1, but is different in the following points. The bias circuit 210 is connected to the amplifier 230 disposed as the subsequent stage of the bias circuit 210 by a bias signal line 212, and similarly, connected to the output section 240 subsequent to the amplifier 230 by a bias signal line 214.

The bias circuit 210 generates a bias voltage BH, equal to, e.g. about 0.5V, and outputs the bias voltage BH to the amplifier 230 over the bias signal line 212. The bias circuit 210 generates a bias voltage BL, equal to, e.g. about 0.3V, and outputs the bias voltage BL to the output section 240 over the bias signal line 214. In addition, the bias voltage Bu generated from the bias circuit 210 is able to provide constant-current controls on the PMOS transistor MP1 of the amplifier 230 and a PMOS transistor MP3B working as a constant-current source in the output section 240. In addition, the bias voltage BL generated from the bias circuit 210 is able to provide a constant current control over an NMOS transistor MN3B working also as a constant-current source in the output section 240.

The bias circuit 210 may also be a well-known type of circuit, and it may be whatever has its configuration capable of generating and outputting two different kinds of bias voltages of low power supply voltages of, for example, about 0.3V-0.5V, on the two signal lines, i.e. the bias signal lines 212 and 214, respectively.

The oscillatory circuit 220 may be of exactly the same configuration, function, and connection as the oscillatory circuit 120, FIG. 1, of the oscillatory signal output circuit 100.

Also, the oscillatory circuit 220 extracts the oscillatory signal, i.e. a reference oscillatory signal, by using the crystal resonator X'tal, but a crystal resonator may not be required so far as a type of circuit configuration can accomplish an intended oscillation frequency and amplitude. For example, an oscillatory circuit using a ceramic resonator, a CR oscillation circuit, an LC tuning oscillation circuit, etc., can be used if they are available.

The amplifier 230 may also be basically the same configuration, function, and connection as the amplifier 130 of the oscillatory signal output circuit 100, FIG. 1, but the connection is partly different. The difference resides in that the amplifier 230 has a node P1 added to the bias signal line 212, and the node P1 is connected to the gate electrode of an also additional PMOS transistor MP3B working as a constant-current source in the output section 240 subsequent to the amplifier 230 by the bias signal line 232. Therefore, the bias voltage BH (about 0.5V with the alternative embodiment) from the bias circuit 210 is applied to the gate electrode of the PMOS transistor MP3B of the output section 240.

The amplifier 230 may also be whatever has its configuration that can amplify the output signal, for example, sine wave, etc., oscillating in the oscillatory circuit 220 based on the bias voltage BH from the bias circuit 210, and output or develop the output signal on the output section 240. It can be said that the amplifier 230 is also a basic configuration of amplifier.

The connection relationship between the bias circuit 210, the oscillatory circuit 220, and the amplifier 230 may be almost the same as between the bias circuit 110, the oscillatory circuit 120, and the amplifier 130 of the oscillatory signal output circuit 100 of the embodiment shown in and described with reference to FIG. 1. The differences reside in that a node or connection point P1 is provided for the bias signal line 212 of the amplifier 230, and the bias signal line 232 is connected from the node P1 to the output section 240. The bias circuit 210 is connected to the output section 240 by the bias signal line 214. The bias circuit 210, the oscillatory circuit 220, and the amplifier 230 form a reference oscillatory signal amplifier.

The output section 240, i.e. bias voltage generator, is comprised of capacitance elements C1 and C2, the PMOS transistors MP2B and MP3B, the NMOS transistors MN2B and MN3B, nodes P2BG, P2BD, N2BG, and N2BD, and the output part or output signal generator 250.

In the output part 240, the resistors R2 and R1 in FIG. 1 of the embodiment shown in FIG. 1 are changed to the NMOS transistors MN3B and MP3B respectively, and the name of the nodes is changed. The bias voltage BH is applied to the gate electrode of the PMOS transistor MP3B connected to the bias signal lines 232 and 212 connected by the node P1. Also, the bias voltage BL is applied to the gate electrode of the NMOS transistor MN3B to be connected by the bias signal line 214.

The PMOS transistor MP2B has its gate electrode connected to the node P2BG, its source electrode connected to the power supply voltage VDD and its drain electrode connected to the node P2BD.

The NMOS transistor MN2B has its gate electrode connected to the node N2BG, its source electrode grounded (GND), and its drain electrode connected to the node N2BD.

The NMOS transistor MN3B has its gate electrode connected to the bias signal line 214, its source electrode grounded (GND), and its drain electrode connected to the node P2BD.

The PMOS transistor MP3B has its gate electrode connected to the bias signal line 232 by the node P1 provided for the bias signal line 212, its source electrode connected to the power supply voltage VDD, and its drain electrode connected to the node N2BD.

The output part 250 is comprised of the PMOS transistor MP4B and an NMOS transistor MN4B. The PMOS transistor MP4B has its gate electrode connected to the node P2BD of the output section 240, its source electrode connected to the power supply voltage VDD, and its drain electrode connected to the node P4BN4B.

The NMOS transistor MN4B has its gate electrode connected to the node N2BD of the output section 240, its source electrode grounded (GND), and its drain electrode is connected to the node P4BN4B, which is in turn connected to the output terminal (OUT) 260.

In the alternative embodiment also, the output section 240 including the bias circuit 210, the amplifier 230, and the output part 250, and the output terminal (OUT) 260 is packed into one chip of LSI together. Only the oscillatory circuit 220 is disposed outside the one chip of LSI, and the one chip of LSI and the oscillatory circuit 220 are connected by the shortest distance.

In operation, a bias signal, or the bias voltage, BH (about 0.5V) is applied to the amplifier 230 on the bias signal line 212 from the bias circuit 210. The bias voltage BH is applied to the gate electrode of the PMOS transistor MP1 of the amplifier 230 from the bias signal line 212. Applying the bias voltage BH to the gate electrode of the PMOS transistor MP1, having its threshold voltage of about 0.55V, enables the PMOS transistor MP1 to be operative, i.e. active, and a constant current flows through the PMOS transistor MP1 by applying a voltage (about 0.7V) from the power supply voltage VDD.

Accordingly, the constant current defines a voltage (about 0.3V) applied to the gate electrode of the NMOS transistor MN1, having its threshold voltage of about 0.25V, by the voltage VDD through the feedback resistance RF, and the node P1N1, PN and P. The voltage also enables the NMOS transistor MN1 to be active, a voltage or a current applied through the nodes D and G of the oscillatory circuit 220 triggers oscillation of the crystal resonator X'tal of the oscillatory circuit 220, and the amplifier 230 amplifies the oscillating amplitude. At the time, the capacitors CD and DG modify an oscillatory frequency of the crystal resonator X'tal.

As shown in FIG. 3, the waveform of the oscillatory signal at the node D is a sine waveform as the output signal XTB shows, and the waveform of the oscillatory signal at the node G is also a sine waveform XT. The sine waveform of the output signal XT at the node G is smaller in amplitude than the output signal XTB at the node D because the capacitance of the capacitor CD is smaller than that of the capacitor CC.

In addition, the waveform of the oscillatory signal at the nodes D, N, PN, and P is a sinusoidal waveform as the output signal XTB as shown in FIG. 3. The nodes D, N, PN, and P at the stage preceding to the capacitor C1 are called the first node, as stated earlier.

Now, description will be made starting with the output signal XTB transmitted from the node P to the output section 240. The output signal XTB shown in FIG. 3 is transferred from the node P to the node P2BG through the capacitor C1 with its DC component rejected and its AC component extracted. That is capacitive coupling as stated. Because the node P2BG is connected to the gate electrode of the PMOS transistor MP2B, the output signal XTB whose DC component is rejected is applied to the gate electrode of the PMOS transistor MP2B. Therefore, the PMOS transistor MP2B becomes active, and the power supply voltage is applied from power supply voltage VDD.

Since the bias signal line 214 of the bias circuit 210 is connected to the gate electrode of the NMOS transistor MN3B, having its threshold voltage of about 0.25V, the NMOS transistor MN3B is previously active by applying the bias voltage BL (about 0.3V) from the bias signal line 214. Because the first bias voltage is applied to be based on a current flowing through the NMOS transistor MN3B, the output signal XTB is level-shifted up, and will take the waveform of the output signal XTP at the node P2BD as shown in FIG. 3. The output signal XTP level-shifted up at the node P2BD is applied to the gate electrode of the PMOS transistor MP4B of the output part 250. The node P2BD at the stage subsequent to the capacitor C1 is the second node as defined earlier.

Similarly, description will be given starting with the output signal XTB transferred from the node N to the output section 240. The output signal XTB shown in FIG. 3 is conveyed from the node N to the node N2BG through the capacitor C2 with its DC component rejected and its AC component extracted. That is also capacitive coupling. Because the node N2BG is connected to the gate electrode of the NMOS transistor MN2B, the output signal XTB whose DC component is rejected is applied to the gate electrode of the NMOS transistor MN2B. Therefore, the NMOS transistor MN2B becomes active, i.e. conductive to receive the ground level GND.

Also, the bias signal line 212 of the bias circuit 210 is connected to the gate electrode of the PMOS transistor MP3B, having its threshold voltage of about 0.55V, by the node P1 and the bias signal line 232 of the amplifier 230, and therefore the PMOS transistor MP3B is previously active by applying the bias voltage BH (about 0.5V) from the bias signal line 212. Because the second bias voltage is applied to be based on a current flowing through the PMOS transistor MP3B, the output signal XTB is level-shifted up, and takes the waveform of the output signal XTN at the node P2BD as shown in FIG. 3. The output signal XTN level-shifted up at the node N2BD is applied to the gate electrode of the NMOS transistor MN4B of the output part 250. The node N2BD at the stage subsequent to the capacitor C1 is called the third node again.

In the output part 250, applying the output signal XTP from the node P2BD to the gate electrode of the PMOS transistor MP4B enables the PMOS transistor MP4B to be active. At the same time, applying the output signal XTN from the node N2BD to the gate electrode of the NMOS transistor MN4B enables the NMOS transistor MN4B to be active. The PMOS transistor MP4B and the NMOS transistor MN4B operate in response to the output signals XTP and XTN, FIG. 3. When voltages of the output signal XTP applied to the gate electrode of the PMOS transistor MP4B and the output signal XTN applied to the gate electrode of the NMOS transistor MN4B decrease at the same time, the drain current of the NMOS transistor MN4B decreases so that a voltage near the high (H) level (about 0.7V) is outputted. Similarly, when voltages of the output signal XTP applied to the gate electrode of the PMOS transistor MP4B and the output signal XTN applied to the gate electrode of the NMOS transistor MN4B increase at the same time, the drain current of the NMOS transistor MN4B increases so that a voltage near the low (L) level (about 0.0V corresponding to the ground level) is outputted. As above stated, in the output part 250, the PMOS transistor MP4B and the NMOS transistor MN4B operate, the output signal from the output part 250 is outputted on the output terminal (OUT) 260 through the output node P4BN4B, refer to the waveform of the output terminal (OUT) in FIG. 3.

Thus, centering voltage values of bias points amplified, modified and level-shifted up by a set of PMOS transistor MP2B and NMOS transistor MN3B and a set of NMOS transistor MN2B and PMOS transistor MP3B, the amplitudes are applied to the gate electrodes of the PMOS transistor MP4B and the NMOS transistor MN4B, respectively. Therefore, the PMOS transistor MP4B and the NMOS transistor MN4B of the output part 250 achieve large gains, and are enabled to operate certainly.

In addition, the PMOS transistor MP3B working as a constant-current source enables the gate-source voltage VGS of the NMOS transistor MN2B to be constant regardless of a fluctuation in power supply voltage, and therefore the voltage VGS of the NMOS transistors MN4B is also enabled to be constant even when the power supply voltage fluctuates. Therefore, the NMOS transistor MN4B is substantially free from fluctuation in gain that would otherwise be caused by a fluctuation in power supply voltage.

Likewise, the NMOS transistor MN3B working as a constant-current source enables the gate-source voltage VGS of the PMOS transistor MP2B to be constant regardless of a fluctuation in power supply voltage, and correspondingly the gate-source voltage VGS of the PMOS transistors MP4B is enabled to be constant even when the power supply voltage fluctuates. Therefore, the PMOS transistor MP4B is substantially free from fluctuation in gain which would otherwise be caused by a fluctuation in power supply voltage.

In summary, the current source of a circuit for generating voltages of the biasing points of the gate inputs in the output part 250 is implemented by the transistors, specifically the PMOS transistors MP3B and the NMOS transistor MN3B, to be adapted to generate constant current, so that the voltage values of the biasing points are not affected by fluctuation in power supply voltage, and therefore the output part 250 can accomplish large gain even if the power supply voltage fluctuates.

Thus, even if the power supply voltage fluctuates, then the transistors, specifically the PMOS transistor MP4B and the NMOS transistor MN4B, are ensured to be rendered operative, thus developing the output signal for use as a clock signal, etc., in the form of rectangular wave.

The entire disclosure of Japanese patent application No. 2007-053021 filed on Mar. 2, 2007, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. Oscillatory signal output circuitry comprising:
   an amplifier amplifying an oscillating signal of an oscillatory circuit;
   a first node receiving the amplified oscillating signal;
   a first capacitor connected between said first node and a second node;
   a second capacitor connected between said first node and a third node;
   a first bias voltage generator connected to said second node and providing said second node with a first bias voltage;
   a second bias voltage generator connected to said third node and providing said third node with a second bias voltage; and
   an output signal generator connected to said second node, said third node and an output node, and developing a signal on said output node in response to a signal appearing on said second node and said third node,
   wherein said first bias voltage generator comprises a first P-type field effect transistor and a first constant current source, wherein said first constant-current source is an N-type field effect transistor, and said second bias voltage generator comprises a first N-type field effect transistor and a second constant-current source, wherein said second constant-current source is an P-type field effect transistor, and
   wherein said output signal generator comprises a second P-type field effect transistor having a gate electrode directly connected to a gate electrode and a drain electrode of said first P-type field effect transistor, and a second N-type field effect transistor having a gate electrode directly connected to a gate electrode and a drain electrode of said first N-type field effect transistor.

2. The circuitry in accordance with claim 1, wherein said first bias voltage generator comprises a first load element connected between ground and a drain of said first P-type field effect transistor, a source of said first P-type field effect transistor is directly connected to a power supply source, said second bias voltage generator comprises a second load element connected between a power supply source and a drain of said first N-type field effect transistor, and a source of said first N-type field effect transistor is directly connected to ground.

* * * * *